United States Patent [19]

Kinsky et al.

[11] 3,859,722

[45] Jan. 14, 1975

[54] METHOD OF DIP-SOLDERING PRINTED CIRCUITS TO ATTACH COMPONENTS

[75] Inventors: Siegfried Kinsky, Mitterndorf; Jan Segaert, Munich; Max Matuschek, Munich; Wolfgang Koeppe, Munich, all of Germany

[73] Assignee: Siemens Aktiengesellschaft, Berlin, Germany

[22] Filed: June 8, 1973

[21] Appl. No.: 368,318

[30] Foreign Application Priority Data

June 9, 1972 Germany............................ 2228218

[52] U.S. Cl......................... 29/626, 29/495, 29/497, 29/503, 29/625, 174/68.5, 317/101 C, 317/101 CC

[51] Int. Cl. .............................................. H05k 3/34

[58] Field of Search ............. 29/503, 497, 495, 490, 29/626, 203 R, 203 B, 625; 174/68.5; 317/101 C, 101 CC

[56] References Cited

UNITED STATES PATENTS

| | | | |
|---|---|---|---|
| 2,703,377 | 3/1955 | Hings et al. | 317/101 C |
| 2,777,193 | 1/1957 | Albright et al. | 317/101 C X |
| 3,019,489 | 2/1962 | Burg | 317/101 CC X |
| 3,294,951 | 12/1966 | Olson | 29/503 X |
| 3,300,851 | 1/1967 | Looder | 174/68.5 X |
| 3,714,709 | 2/1973 | Liederbach | 174/68.5 X |

*Primary Examiner*—C. W. Lanham
*Assistant Examiner*—Joseph A. Walkowski
*Attorney, Agent, or Firm*—Hill, Gross, Simpson, Van Santen, Steadman, Chiara & Simpson

[57] ABSTRACT

A method for dip-soldering circuit boards as, for example, ceramic substrates upon which are formed thin or thick film circuits and to which components are to be attached as, for example, miniature ceramic capacitors in which the components are attached to the board with their longitudinal axes extending in the same direction and with the portions of the conductive films to be attached to the components formed on the board so as to be right angles to the longitudinal axes of the components and wherein the board is dipped into the solder bath with an orientation such that the components are on the under-side of the board as it is emersed with the longitudinal axes of the components extending substantially horizontal and with the plane of the circuit board making an angle of approximately 45° with the surface of the solder bath. Portions of the conductive film may be treated to concentrate the solder in desired locations.

6 Claims, 5 Drawing Figures

PATENTED JAN 14 1975 3,859,722

METHOD OF DIP-SOLDERING PRINTED CIRCUITS TO ATTACH COMPONENTS

BACKGROUND OF THE INVENTION

1. Field of the Invention

This invention relates in general to a method of dip-soldering circuit boards as, for example, ceramic substrates upon which thin or thick film circuits are formed and to which components such as ceramic capacitors are to be attached.

2. Description of the Prior Art

Circuit boards upon which thin or thick film conductive paths have been applied made of ceramic ($Al_2O_3$) have had components made of ceramic material connected to the appropriate ones of said conductor paths. The connection of such components to the conductor paths of the circuit board has been accomplished by dipping the board with the components thereon into a solder bath. An adhesive has been used to attach the components to the circuit board to hold them during dip-soldering so that the soldering will occur at the proper locations. The contact points of the components are pretreated by silvering, gilding, or tinning, so as to assure that intimate connection between the contact locations of the components and the conductive paths of the circuit board will be achieved during the dip-soldering process.

It has been discovered that after a period of time such as days or weeks after the boards have been dipped that cracks occur which extend transversely of the longitudinal axes of the components thus rendering the boards defective. Such cracks probably result from the fact that the substrates are slightly curved and apparently the solder and components are placed under stress acting in the longitudinal direction relative to the components in the prior art methods. Such stresses ultimately destroy the components and particularly miniature ceramic capacitors.

SUMMARY OF THE INVENTION

It is an object of the present invention to eliminate the drawbacks and disadvantages of the prior art and to provide a method of dip-soldering components and printed circuit boards so as to prevent the development of excessive tensile stresses in the substrates and/or the components. This is accomplished by orienting the conductive paths of thin or thick films and the components such that the portions of the films to which the components are to be attached extend at right angles to the longitudinal axes of the components. Thus the process of the invention comprises the steps of:

a. orienting all of the components with their longitudinal axes parallel to each other on the circuit board;
b. arranging the portions of the conductive paths to which the components are to be attached at right angles to the longitudinal axes of the components;
c. coating those portions of the conductive paths to which it is not desired that solder stick with a solder-repellent layer, and
d. dip the circuit board in the solder bath such that the longitudinal axes of the components are horizontal and remove it with the same orientation.

It has been discovered that the above method prevents the accumulation of solder at the connection points of the components with the conductive films, and after the solder has solidified no major stresses will be developed in the board and components which will tend to destroy the components.

Process steps *a* and *b* provide for the optimum direction of dipping and step *c* restricts the size of the solder contact and counteracts accumulation of solder. The step *d* ensures that during wave soldering operations and during the withdrawal of the circuit board from the solder that the surplus solder will run off unimpeded from the points of connection between the components and the conductor paths thus preventing excessive solder build-up due to a "scoop effect".

With the method of the invention only as much solder is left behind at the contact locations as is required for effective electrical contact and mechanical support and no excess stresses will exist.

A further feature of the method of the invention comprises preheating the circuit boards and components and coating the soldering locations with a flux and then dipping the board with the film and component side downward such that the board makes an angle of approximately 45° with the surface of the solder bath during emersion and withdrawal, and wherein an emersion time of at least 3 seconds is used. The preferable time for dipping has been noted as being 4 seconds. With the film circuit into the molten solder at an angle of 45° with the surface of the bath and with the film side facing the solder bath, it has been discovered that bubble-free soldering results and the excess solder flows from the circuit board as it is withdrawn from the bath.

Thus utilizing a ceramic substrate carrying thin or thick film circuits and components attached to the conductor paths by dip-soldering wherein the longitudinal axes of all the components are mounted on the substrate parallel to one another in such that they make a right angle with the portions of the conductor paths at which the solder connection is to be made.

A circuit which has long life and is much more reliable than those of the prior art results.

Other objects, features, and advantages of the invention will be readily apparent from the following description of certain preferred embodiments thereof taken in conjunction with the accompanying drawings although modifications and variations may be effected without departing from the spirit and scope of the novel concepts of the disclosure, and in which:

DESCRIPTION OF THE PREFERRED EMBODIMENTS

Figure 1:
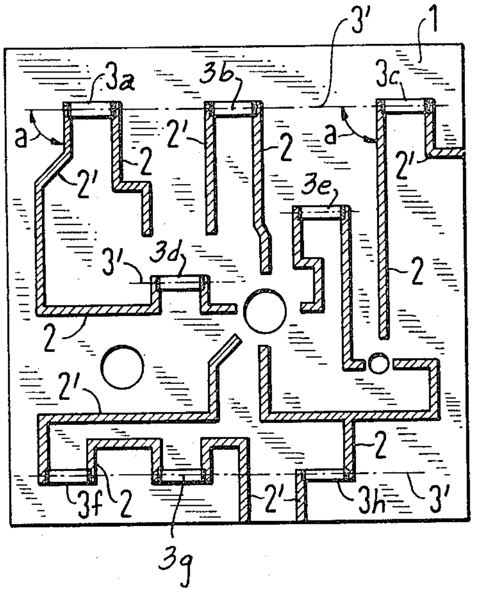
FIG. 1 is a plan view of the circuit board according to the invention wherein the components and portions of the thin and thick conductive paths are aligned according to the invention.

FIG. 1 is a plan view of the printed circuit board 1 which may be a ceramic material such as aluminum oxide ($Al_2O_3$) to which thick film conductor paths 2 have been applied in a manner known in the prior art. A plurality of components 3 (designated as $3_a - 3_h$) in FIG. 1 and which might be miniature ceramic material capacitors have end portions which engage individual conductor paths 2 and 2′ and are soldered to the conductor paths by dip-soldering.

It is to be noted that the components $3_a - 3_h$ are arranged on the board 1 such that their longitudinal axes 3′ are disposed parallel to each other. The ends of the components are connected to the conductor paths 2′ and 2 such that those portions of the conductor paths at which the components are mounted make a right angle with the longitudinal axes 3′ of the components as shown. In other words the conductor paths 2′ and 2 extend transversely of the components $3_a - 3_h$.

Figure 2:
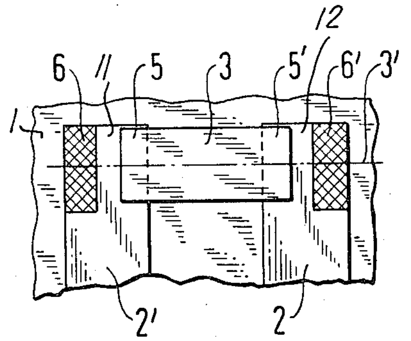
FIG. 2 is an enlarged detailed view illustrating a component and a pair of conductive paths.

FIG. 2 is an enlarged detailed view of a component 3 which has its end regions 5 and 5′ overlying portions of the conductive paths 2′ and 2. Prior to soldering the components 3 are attached to the circuit board by means of an adhesive and such that their end regions 5 and 5′ touch portions 11 and 12 of the conductor paths 2′ and 2. Portions 6 and 6′ of the conductor paths 2′ and 2 adjacent the component are not to have solder deposited on them during the dip-soldering operation and are coated with a varnish or other suitable material for repelling solder. Then the board is preheated and is coated at the surfaces which are to be soldered with a flux and are then dipped in a solder bath.

Figures 3, 4:
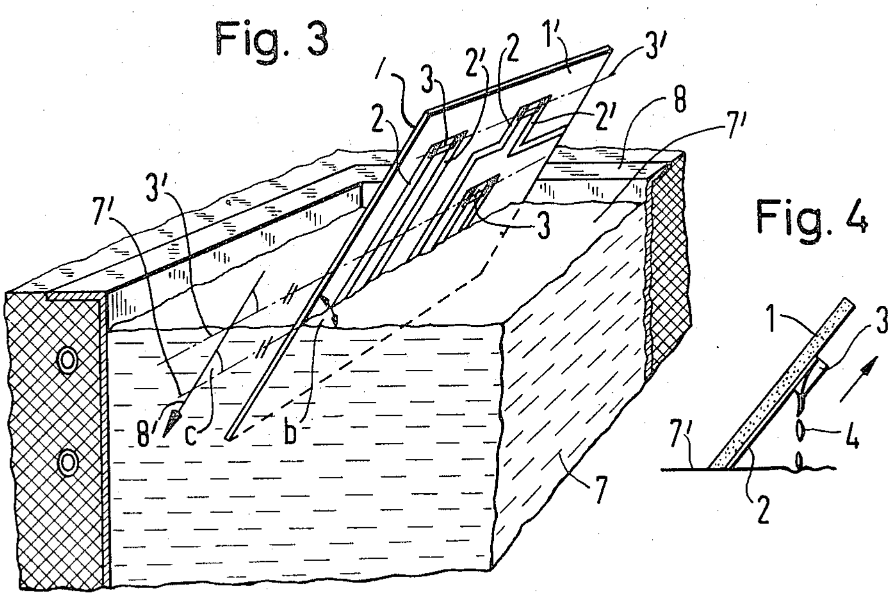
FIG. 3 is a cutaway perspective view illustrating circuit board of the invention being dipped into a solder bath.
FIG. 4 is an end view of the circuit board as it's withdrawn from the solder bath.

FIGS. 3 and 4 illustrate the orientation of the board during the dipping and removing step. The surface 1′ of the circuit board which carries the components and the conductor paths is arranged so that it faces the surface 7′ of the liquid tin solder 7. Also during dip-soldering the circuit board is aligned such that the longitudinal axes 3′ of the components 3 extend horizontal and at an angle *c* which is 90° to the direction dipping 8′. The longitudinal axes 3′ extend parallel to the surface 7′ of the solder bath surface 7′. An emersion time of at least 3 and preferably 4 seconds is utilized for dipping.

FIG. 4 is a sectional view illustrating the circuit board 1 as it is being withdrawn from the solder bath vessel 8. Due to the orientation of the board and the components relative to the bath excess solder 4 will drop from the connection points between the conductor paths and the components back into the solder bath 7 and accumulation of solder during withdrawal from the bath will not occur.

Figure 5:
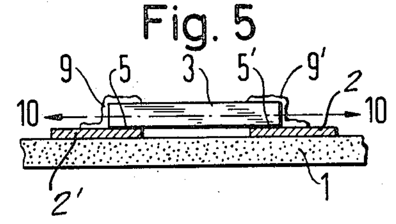
FIG. 5 is a side sectional view through the circuit board illustrating a component which has been attached to a pair of conductive paths.

FIG. 5 is a sectional view through the printed circuit board 1 after the soldering process has been completed and is to be observed that the solder 9 and 9′ at the end regions 5 and 5′ of the component 3 has a substantially uniform thickness as it overlies the conductive paths 2′ and 2 and the component 3. Thus excessive solder which would subject the components, conductive paths, and board to excess stresses is eliminated.

It is seen that this invention provides a new and novel method for dip-soldering printed circuit boards and although it has been described with respect to preferred embodiments it is not to be so limited as changes and modifications may be made which are within the full intended scope of the invention as defined by the appended claims.

We claim:

1. A method of dip-soldering circuit boards such as ceramic substrates which carry thin or thick film circuits and components comprising the following steps:
   a. arranging all of the film circuit portions which are to contact said components parallel to each other,
   b. arranging all of the longitudinal axes of the components parallel with one another with opposite ends on the film circuits and such that the longitudinal axes of said components are at right angles to said portions of said film circuits,
   c. coating those portions of said film circuits which are not to be wetted with solder with a solder-repellant substance in the proximity of the areas of contact with said components, and
   d. dipping said circuit board into a solder bath with an orientation such that the longitudinal axes of said components are parallel to the surface of said bath.

2. The method according to claim 1 comprising heating and circuit board and coating the areas to be coated with solder with a flux before dipping in said solder bath and dipping the board with the film side downwards such that the board makes an angle of 45° with the horizontal, and leaving said board immersed 3 seconds or longer.

3. The method of bonding components to film circuit boards comprising the steps of:
   a. forming component attaching areas comprising portions of film at both ends of said components on said circuit board and said portions of film extending parallel to each other and at right angles to axes extending through associated component attaching areas,
   b. mounting each of said components such that its contact areas engage said component attaching areas, and
   c. dipping and removing said circuit board into a solder bath with the circuit board having an orientation such that the contact areas of said components are horizontal.

4. The method of claim 3 wherein said circuit is dipped into and removed from said solder bath with said film and components on the underside of said board and said board makes a 45° angle with the surface of said bath.

5. The method of claim 4 including the step of preheating said board and placing flux on the areas to be soldered prior to dipping.

6. The method of claim 5 including the step of placing a coating on said film where soldering is not derived prior to dipping.

* * * * *